(12) United States Patent
Cho et al.

(10) Patent No.: US 7,282,394 B2
(45) Date of Patent: Oct. 16, 2007

(54) PRINTED CIRCUIT BOARD INCLUDING EMBEDDED CHIPS AND METHOD OF FABRICATING THE SAME USING PLATING

(75) Inventors: Suk Hyeon Cho, Daejeon (KR); Chang Sup Ryu, Daejeon (KR); Doo Hwan Lee, Chungcheongbuk-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 11/179,864

(22) Filed: Jul. 11, 2005

(65) Prior Publication Data

US 2006/0145331 A1    Jul. 6, 2006

(30) Foreign Application Priority Data

Dec. 30, 2004    (KR) .................... 10-2004-0116809

(51) Int. Cl.
*H01L 21/44* (2006.01)
*H01L 21/48* (2006.01)

(52) U.S. Cl. .................. 438/118; 438/124; 438/125; 257/E23.131

(58) Field of Classification Search .............. 438/118, 438/124, 125; 257/E23.131
See application file for complete search history.

(56) References Cited

U.S. PATENT DOCUMENTS 4,729,061 A * 3/1988 Brown ...................... 361/719
5,592,737 A * 1/1997 Middelman et al. .......... 29/848
6,606,793 B1   8/2003 Dunn
2004/0014317 A1* 1/2004 Sakamoto et al. .......... 438/689
2004/0168825 A1* 9/2004 Sakamoto et al. .......... 174/260

FOREIGN PATENT DOCUMENTS

| JP | 2004-7006 A | 1/2004 |
|---|---|---|
| JP | 2004-153084 A | 5/2004 |
| WO | WO-01/19148 A1 | 3/2001 |

OTHER PUBLICATIONS

Patent Abstracts of Japan for 2004-007006 published on Jan. 8, 2004.
Patent Abstracts of Japan for 2004-153084 published on May 27, 2004.

* cited by examiner

*Primary Examiner*—William M. Brewster
(74) *Attorney, Agent, or Firm*—Darby & Darby

(57) ABSTRACT

A method of fabricating a printed circuit board (PCB) including embedded chips, composed of forming a hollow portion for chip insertion through a substrate, inserting the chip into the hollow portion, fixing the chip to the substrate by use of a plating process to form a central layer having an embedded chip, and then laminating a non-cured resin layer and a circuit layer having a circuit pattern on the central layer. Also, a PCB including embedded chips fabricated using the above method is provided.

6 Claims, 10 Drawing Sheets

PRINTED CIRCUIT BOARD INCLUDING EMBEDDED CHIPS AND METHOD OF FABRICATING THE SAME USING PLATING

INCORPORATION BY REFERENCE

The present application claims priority under 35 U.S.C. §119 to Korean Patent Application No.: 10-2004-0116809 filed on Dec. 30, 2004. The content of the application is incorporated herein by reference in its entirety.

BACKGROUND OF THE INVENTION

1. Field of the Invention

The present invention relates, generally, to a printed circuit board (PCB) including embedded chips, and a fabricating method thereof. More particularly, the present invention relates to a method of fabricating a PCB including embedded chips, including forming a hollow portion for chip insertion through a substrate, inserting the chip into the hollow portion, fixing the chip to the substrate by use of a plating process to form a central layer having an embedded chip, and then laminating a non-cured resin layer and a circuit layer having a circuit pattern on the central layer; and a PCB including embedded chips fabricated by the above method.

2. Description of the Related Art

With the great improvement of electronic industries, to correspond to electronic products requiring miniaturization and high functionality, electronic technologies have been developed to insert resistors, capacitors, ICs (integrated circuits), etc., into substrates.

Although discrete chip resistors or discrete chip capacitors have long since been mounted on PCBs, PCBs including embedded chips, such as resistors or capacitors, have only recently been developed.

In techniques of manufacturing PCBs including embedded chips, the chips, such as resistors or capacitors, are inserted into an outer layer or an inner layer of the substrate using novel materials and processes, to substitute for conventional chip resistors and chip capacitors.

That is, the PCB including embedded chips means that the chips, for example, capacitors, are embedded in the inner layer of the substrate itself or outer layer thereof. Regardless of the size of the substrate itself, if the chip is incorporated into the PCB, this is called an 'embedded chip'. Such a substrate is referred to as an 'embedded chip PCB'.

The major characteristic of the embedded chip PCB is that the chip is intrinsically provided in the PCB without the need to mount the chip on the substrate.

In general, fabrication techniques of the embedded chip PCB are largely classified into three types.

First, a method of manufacturing a polymer thick film type capacitor is provided, comprising applying a polymer capacitor paste, which is then heat cured, that is, dried. Specifically, this method comprises applying a polymer capacitor paste onto an inner layer of a PCB, and drying the polymer capacitor paste, on which a copper paste is then printed and dried, to form electrodes, thereby obtaining an embedded capacitor.

Second, a method of manufacturing an embedded discrete type capacitor is provided, comprising coating a PCB with a ceramic filled photosensitive resin, which has been patented by Motorola Co. Ltd., USA (U.S. Pat. No. 6,606,793). The above method comprises applying the photosensitive resin containing ceramic powder on the substrate, laminating a copper foil layer on the resin layer to form upper electrodes and lower electrodes, forming a circuit pattern, and then etching the photosensitive resin, thereby obtaining a discrete capacitor.

Third, a method of manufacturing an embedded capacitor is provided, comprising separately inserting a dielectric layer having capacitance properties into an inner layer of a PCB, so as to substitute for a decoupling capacitor mounted on a PCB, which has been patented by Zycon Corp.Ltd., USA (U.S. Pat. No. 5,079,069). In this method, the dielectric layer having power electrodes and ground electrodes is inserted into the inner layer of the PCB, thereby obtaining a power distributed decoupling capacitor.

To fulfill various functions and superb performance of electronic products, higher speed electronic components are increasingly required. Also, with the aim of increasing the speed of the component, a package bonding manner is changed from typical bonding manners, such as lead frame, wire bonding, pin type bonding, etc., into a small ball type bonding manner or a flip-chip bonding manner.

In the case of a high speed product that adopts a flip-chip bonding manner or in the case of a central processing unit (CPU) or a graphic chip set, a clock is operated at a speed of 2 GHz or more.

Such a CPU or chip set requires a short signal rising time and a high current, and is designed to further decrease intervals between signal lines of an integrated circuit (IC), flip chip package and a main board for operation at high speeds.

However, as the speed of the component increases, voltage fluctuation of a power line occurs, resulting in the generation of a lot of high frequency noise, such as SSN (Simultaneous Switching Noise) or delta-I ($\Delta I$).

The high frequency noise (e.g., SSN) causes system delay or a logic fault, thereby decreasing the performance and reliability of the system.

Therefore, the SSN may be effectively reduced by lowering the inductance of the power line when the current and the switching speed required for the operation of devices are unchangeable. In addition, the decoupling capacitor is used to reduce the voltage fluctuation of the power line.

The decoupling chip capacitor is mounted to the power line, whereby a current required for switching the circuit can be directly fed. Thus, the inductance of the power line is shielded, and hence, a voltage drop phenomenon is remarkably lowered and the SSN may be reduced, too.

FIGS. 1A to 1F sequentially show a process of fabricating a PCB including embedded chips, according to a first conventional technique, which is disclosed in Japanese Patent Laid-open Publication No. 2004-7006.

In FIG. 1A, an insulating layer 1 is processed to have a hollow portion 3 therethrough, and also, through holes 2 are formed through the insulating layer 1 and filled with conductive ink.

In FIG. 1B, a circuit forming process is performed on a protective film 6, and thus, a predetermined circuit pattern 4 is formed thereon.

In FIG. 1C, an electrical component 5 is mounted on the circuit pattern 4.

In FIG. 1D, the insulating layer 1 having the through holes 2 filled with the conductive ink adheres to the circuit pattern 4.

In FIG. 1E, the protective film 6 is removed from the circuit pattern 4, to form a central layer 1.

In FIG. 1F, circuit layers 7 and 8 having predetermined circuit patterns 9 and via holes 11 filled with conductive ink are formed, and then laminated on both surfaces of the central layer 1.

FIGS. 2A to 2D sequentially show a process of fabricating a PCB including embedded chips, according to a second conventional technique, which is disclosed in Japanese Patent Laid-open Publication No. 2004-7006.

In FIG. 2A, a circuit layer 20 having a predetermined circuit pattern 22 and through holes 21 is formed.

In FIG. 2B, an electrical component 23 is mounted on the predetermined circuit pattern 22 of the circuit layer 20.

In FIG. 2C, a hollow portion of a central layer 25 is formed, after which the central layer 25 is processed to have a predetermined circuit pattern 26 and through holes 27 and is then laminated on the circuit layer 20.

In FIG. 2D, a circuit layer 28 having a predetermined circuit pattern 29 and through holes 30 is formed and laminated on the central layer 25.

In such cases, the first and second conventional techniques are disadvantageous because the space between the electrical component and the insulating layer as the central layer is large, and thus, the resultant product has a large size.

Further, the first and second conventional techniques are disadvantageous because the space between the chip and the copper foil layer is large, and thus, efficient radiating effects cannot be obtained.

Furthermore, the second conventional technique is disadvantageous because a build-up process used for lamination takes a long time.

Turning now to FIG. 3A, constitutive layers of a PCB including embedded chips upon lamination are schematically shown, according to a third conventional technique. Also, FIGS. 3B to 3F sequentially show a process of forming a core of each layer of FIG. 3A. The above technique is disclosed in Japanese Patent Laid-open Publication No. 2004-153084.

In FIG. 3A, a lower circuit layer is composed of a film 8 having a predetermined circuit pattern 3 and a radiating pattern 6, in which conductive ink 9 is applied on the radiating pattern 6.

Then, a hollow portion is formed through a film 8 and then the film 8 is further processed to have a predetermined circuit pattern 3 and through holes filled with conductive ink 9, to obtain a central layer. As such, the film 8 is provided in the number of layers corresponding to the thickness of an electrical component 5 to be inserted into the hollow portion thereof.

Finally, an upper circuit layer is formed by processing a film 8 to have a predetermined circuit pattern 3 and through holes filled with conductive ink 9, and then the upper and lower circuit layers are laminated on the central layer having an inserted electrical component 5 at one time.

In FIG. 3B, to form a core of each layer, a copper foil layer 10 is laminated on a film 8.

In FIG. 3C, the copper foil layer 10 on the film 8 is subjected to a general circuit forming process to form a circuit pattern 3. A protective film 11 is applied on a lower surface of the film 8.

In FIG. 3D, through holes 8a are formed at positions corresponding to the upper circuit pattern 3 on the film 8 and the protective film 11.

In FIG. 3E, the through holes 8a are filled with conductive ink 9.

In FIG. 3F, the protective film 11 is removed from the film 8.

However, the third conventional technique is disadvantageous in that because the through holes filled with conductive ink adhere to the chip upon simultaneous lamination, the alignment of the layers cannot be accurately controlled.

Moreover, since the radiation takes place using the radiating pattern, limitations are imposed on fabricating a high density circuit due to the formation of a passage required for emission of the radiating pattern.

In this regard, WO 01/19148 discloses a method of embedding a chip condenser in a core layer to reduce the distance between an IC chip and the chip condenser. However, since the chip condenser is simply embedded in the core layer by means of a conductive adhesive, the above method has problems similar to conventional methods of fabricating PCBs including embedded chips.

SUMMARY OF THE INVENTION

Accordingly, the present invention has been made keeping in mind the above problems occurring in the related art, and an object of the present invention is to provide a method of fabricating a PCB including embedded chips, in which a plating process is used to fix a chip to a central layer when the central layer is formed, so that the subsequent processes are easily performed.

Another object of the present invention is to provide a method of fabricating a PCB including embedded chips, in which electrical inspection of the connection state of the chips of the central layer is performed to easily correct errors before other layers are laminated on the central layer.

A further object of the present invention is to provide a PCB including embedded chips and a method of fabricating the same, in which solder need not be used to electrically connect the chips, and hence, noise due to the solder is not generated.

Still another object of the present invention is to provide a PCB including embedded chips and a method of fabricating the same, in which electrical connection properties of the chips embedded in the PCB are improved.

In order to accomplish the above objects, the present invention provides a method of fabricating a PCB including embedded chips, including the steps of forming a hollow portion, into which a chip is to be inserted, and a via hole through a copper clad laminate; inserting the chip into the hollow portion; plating the entire surface of the substrate; forming circuit patterns on both surfaces of the substrate to form a central layer; and laminating one or more circuit layers and one or more insulating layers on the substrate.

Further, the present invention provides a PCB including embedded chips, including a central layer through which a through hole and a hollow portion are formed having a chip inserted into the hollow portion to be fixed using a plating process and circuit patterns formed on both surfaces of the central layer; an insulating layer laminated on one surface or both surfaces of the central layer and having a through hole filled with conductive ink; and a circuit layer laminated on the insulating layer and having a via hole and a circuit pattern electrically connected to a plated layer of the central layer through the through hole.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, a detailed description will be given of the present invention, with reference to the appended drawings.

FIGS. 4A to 4G sequentially show a process of forming a central layer in the fabrication method of a PCB including embedded chips, according to the present invention.

Figure 1A:
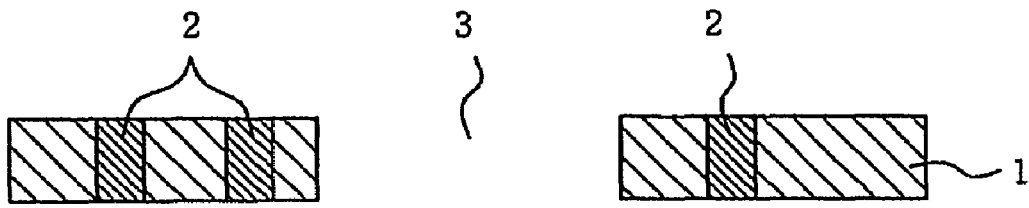
FIGS. 1A to 1F are sectional views sequentially showing a process of fabricating a PCB including embedded chips, according to a first conventional technique.
Figure 1B:
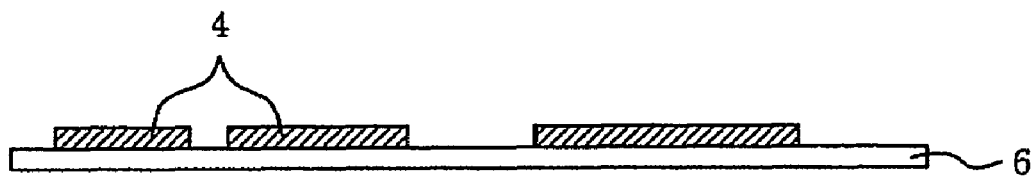
Figure 1C:
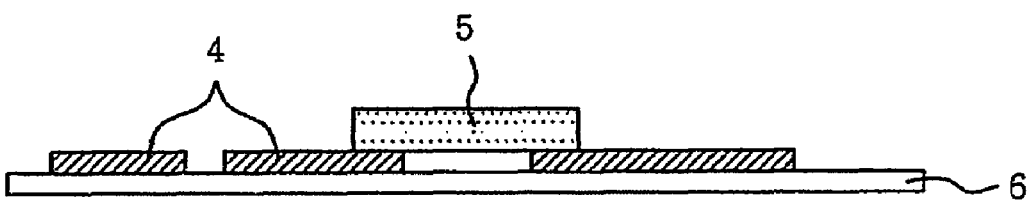
Figure 1D:
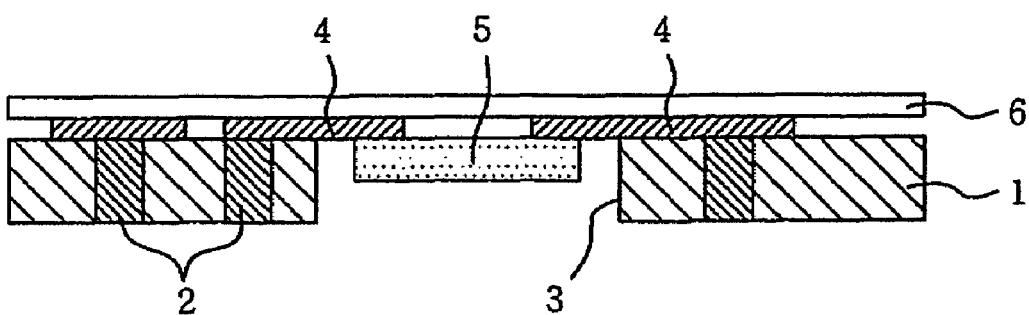
Figure 1E:
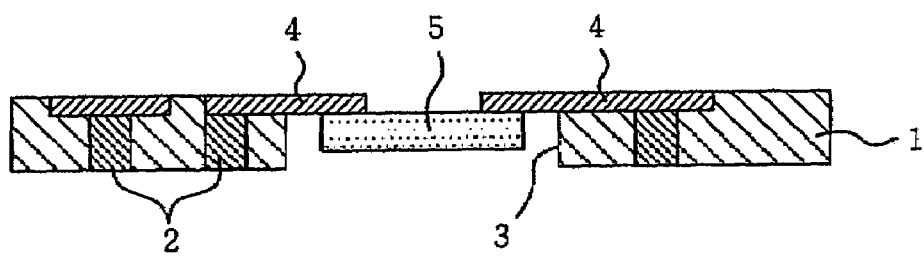
Figure 1F:
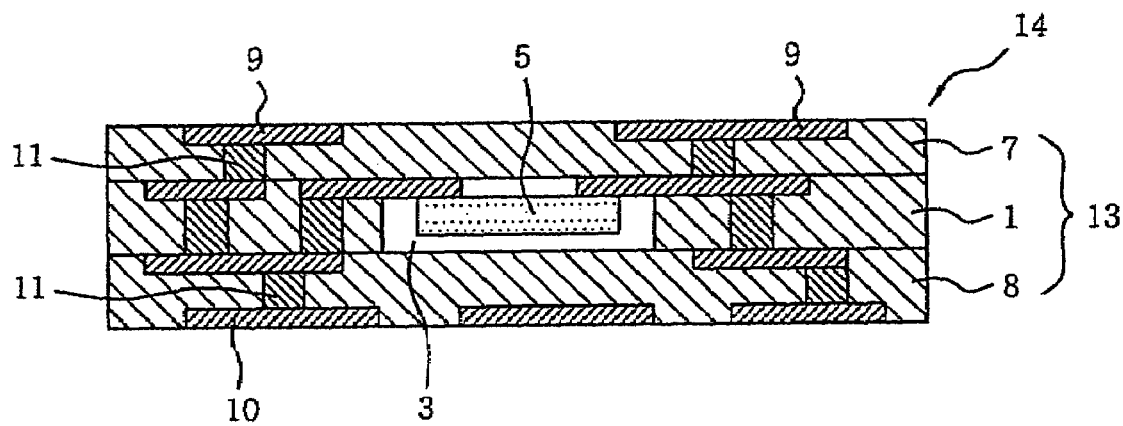
Figure 2A:
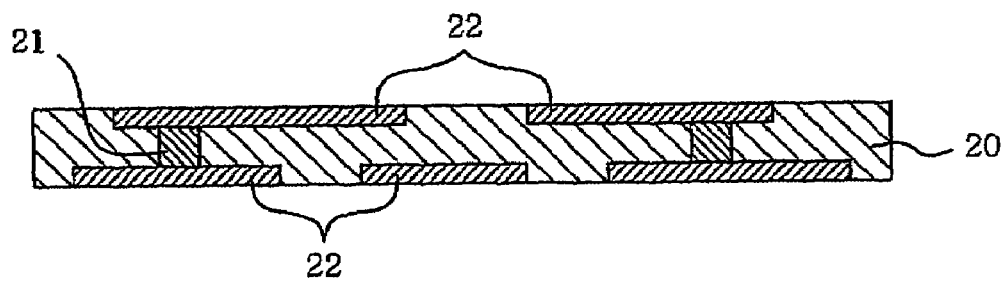
FIGS. 2A to 2D are sectional views sequentially showing a process of fabricating a PCB including embedded chips, according to a second conventional technique.
Figure 2B:
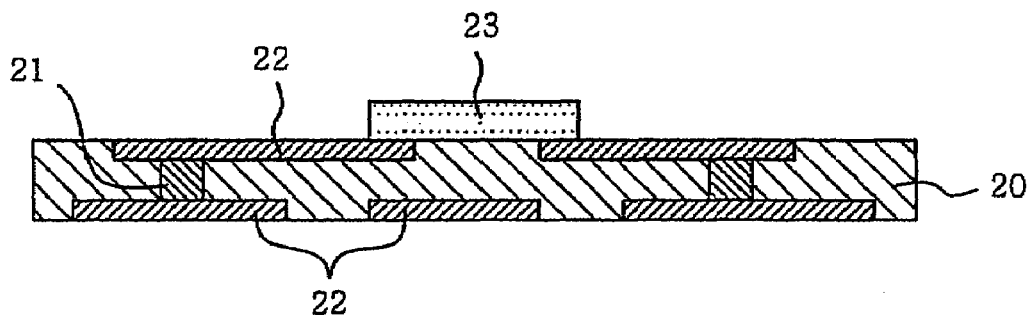
Figure 2C:
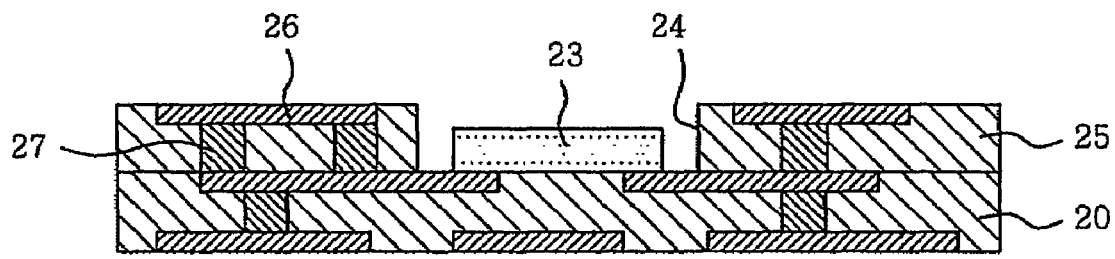
Figure 2D:
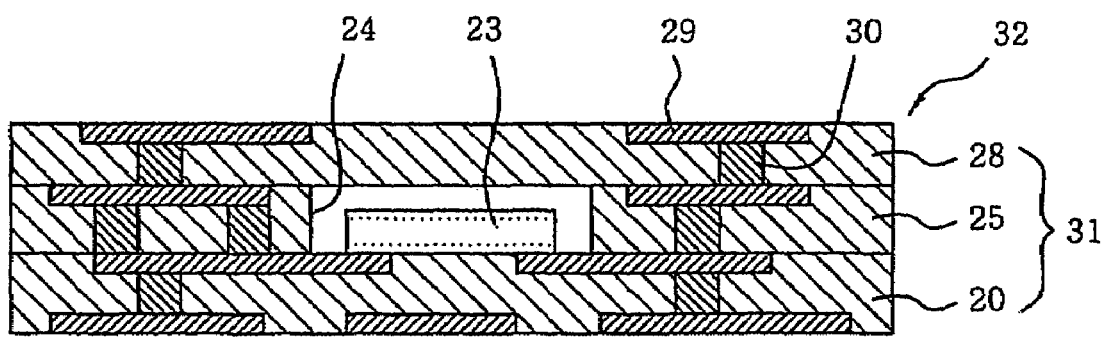
Figure 3A:
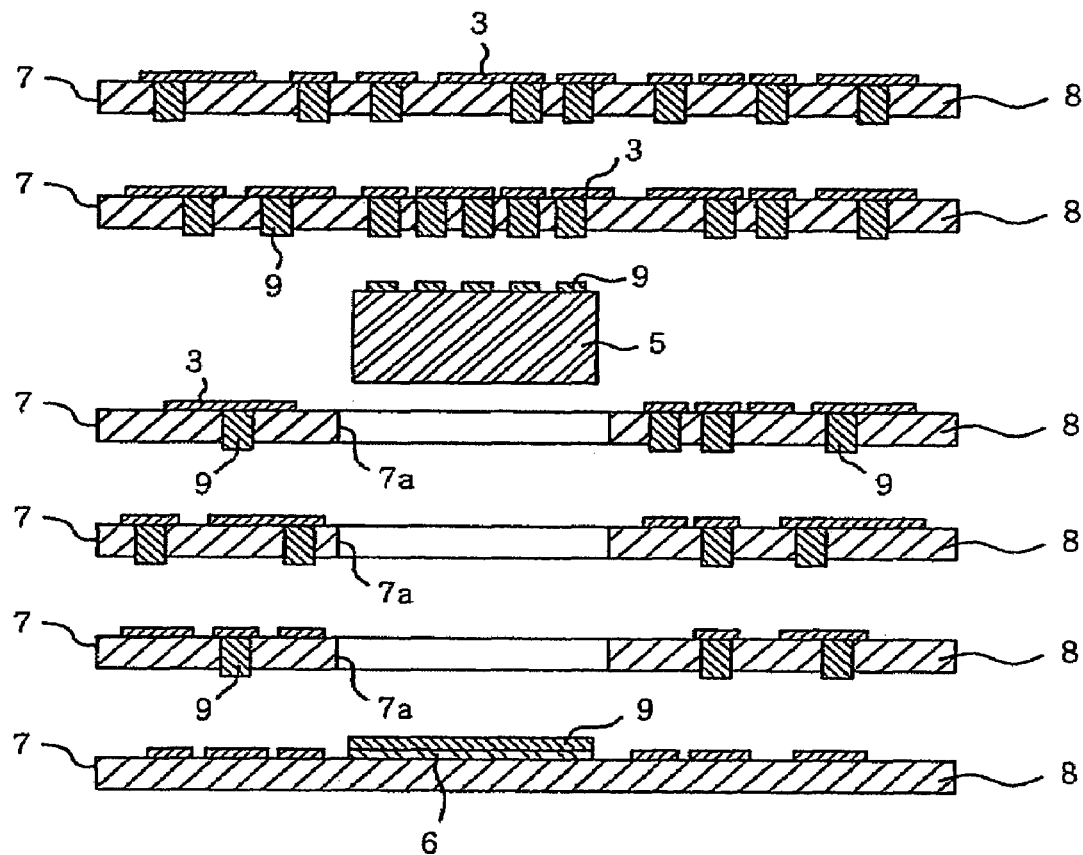
FIG. 3A is sectional views schematically showing constitutive layers of a PCB including embedded chips upon lamination, according to a third conventional technique.
Figure 3B:
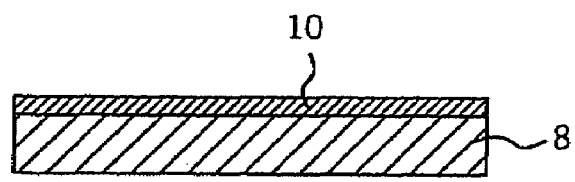
FIGS. 3B to 3F are sectional views sequentially showing a process of fabricating a core of each layer of FIG. 3A.
Figure 3C:
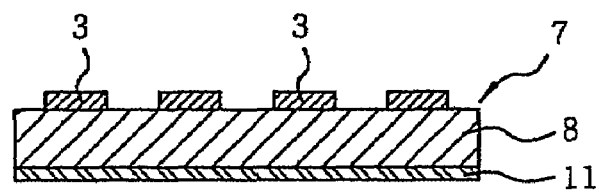
Figure 3D:
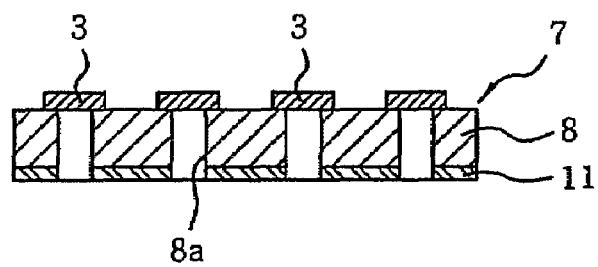
Figure 3E:
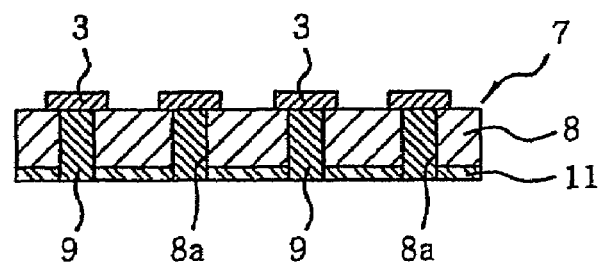
Figure 3F:
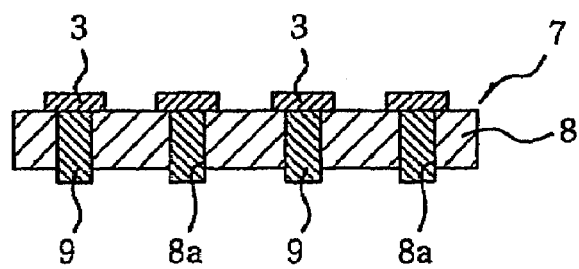
Figure 4A:
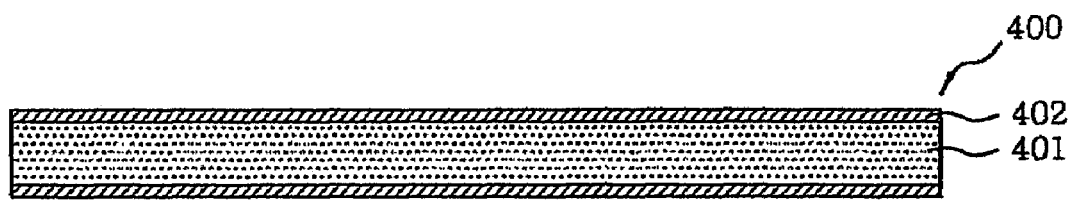
FIGS. 4A to 4G are sectional views sequentially showing a process of forming a central layer in the fabrication method of a PCB including embedded chips, according to the present invention.

In FIG. 4A, a copper clad laminate (CCL) 400 is prepared, which has an insulating resin layer 401 and copper foil layers 402 formed on both surfaces thereof. In this case, the CCL 400 is preferably exemplified by a glass/epoxy CCL having an insulating layer that is formed of an epoxy resin (a mixture of a resin and a curing agent) impregnated into glass fiber and a copper foil layer formed thereon.

Figure 4B:
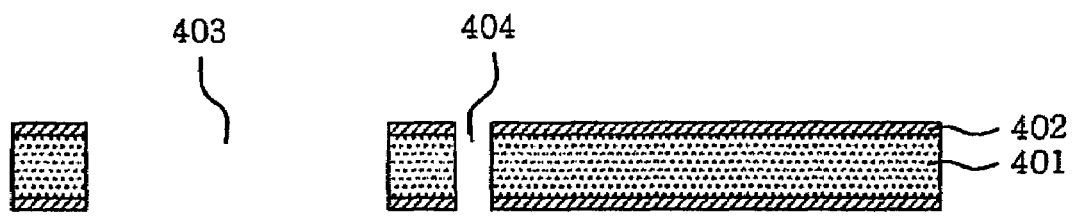

In FIG. 4B, a hollow portion 403, into which a chip is to be inserted, and a via hole 404 are formed through the CCL 400. The formation of the hollow portion 403 and the via hole 404 is preferably carried out by a mechanical drilling process, such as a CNC drilling process. Also, a laser drilling process generally used in the fabrication of PCBs may be applied. However, since a laser cannot pass through the copper foil layer 402, the laser drilling process further requires a process of previously removing the portions of the copper foil layer 402 where the hollow portion 403 and the via hole 404 are to be formed by an etching process. After the drilling process, it is preferable that a desmearing process for removing smear generated by the drilling be performed.

Figure 4C:
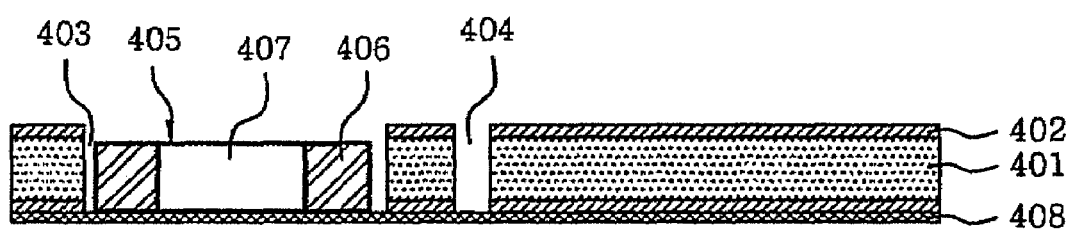

In FIG. 4C, an adhesive sheet 408 formed of a resin is attached to one surface of the CCL 400 having the hollow portion 403, and a chip 405 is inserted into the hollow portion 403.

As such, the chip 405 composed of a body portion 407 and electrode pads 406 comprises a passive component, such as a capacitor or an inductor, or an active component, such as an IC chip. As shown in FIG. 4C, the electrode pads 406 of the chip 405 should be positioned at both sides of the chip 405. Further, since the chip 405 constitutes one layer of the PCB, it is preferably formed to be thin.

When the chip 405 is inserted into the hollow portion 403, it adheres to the adhesive sheet 408. That is, the adhesive sheet 408 functions to temporarily fix the chip 405. As shown in FIG. 4C, it is preferable that the chip 405 be inserted into the hollow portion 403 and be spaced by small intervals from both inner walls of the hollow portion 403.

Figure 4D:
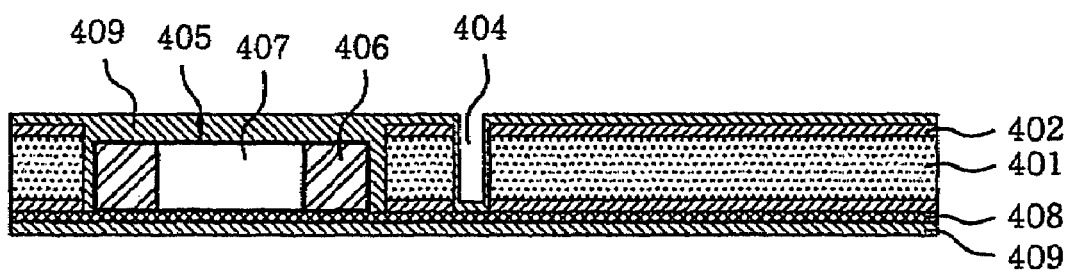

In FIG. 4D, a plating process is performed on the entire surface of the substrate. The surfaces of the substrate are plated, with the exception of the surface of the substrate with the attached adhesive sheet 408 serving as an insulator.

Specifically, the plating process is carried out by electroless plating followed by copper electroplating, because the substrate is formed of an insulating material. Thereby, a plated layer 409 is formed on the surfaces where the adhesive sheet 408 is not attached, in spaces between the chip 405 and the chip-inserted hollow portion 403, and on an inner wall of the via hole 404. Before the plating, a washing process is preferably performed to remove impurities and residue from the entire surface of the substrate including the exposed surface of the chip 405.

Figure 4E:
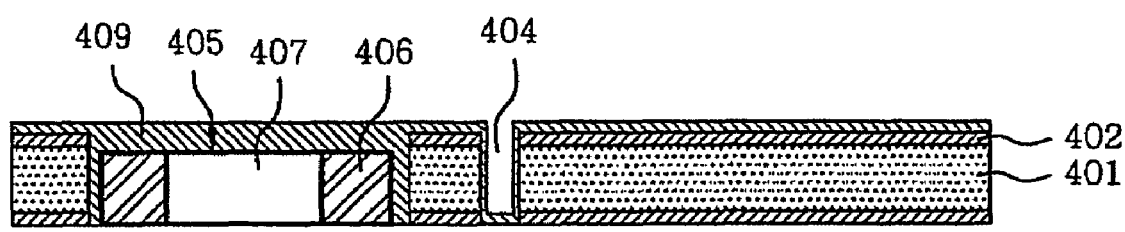

In FIG. 4E, the adhesive sheet 408 is released from the CCL 400. Thereby, the portion of the copper foil layer 402 of the CCL 400 and the portion of the plated layer 409 are externally exposed.

Figure 4F:
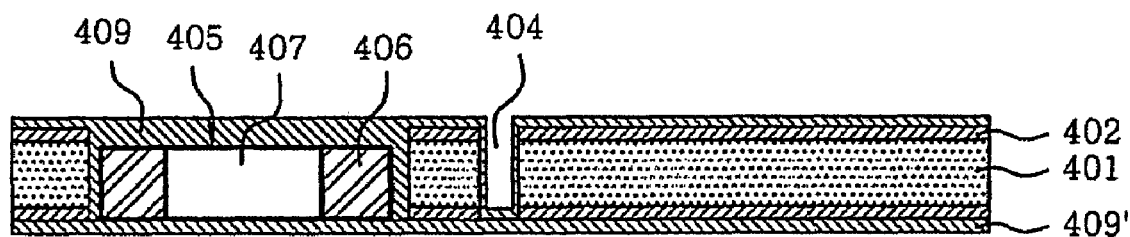

In FIG. 4F, after removal of the adhesive sheet 408, the surface is subjected to electroless plating and then electroplating, to form a plated layer 409'. The plated layer 409' is formed to provide an electrical contact able to electrically conduct the electrode pads 406 of the chip 405. If an electrical contact is provided to the electrode pads 406, the plated layer 409' need not be formed.

Figure 4G:
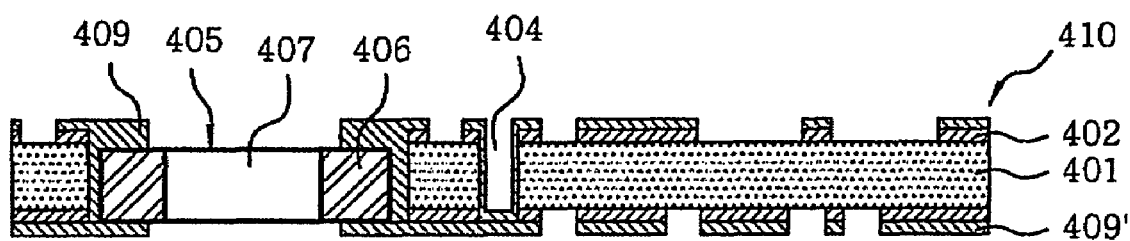

In FIG. 4G, the plated layers 409 and the copper foil layers 402 formed on both surfaces of the substrate are selectively etched to form a circuit pattern, resulting in a central layer 410 including the inserted chip 405.

As such, the etching process comprises applying a photosensitive etching resist on both surfaces of the substrate, placing a mask film designed to be a circuit pattern on the etching resist, and exposing the substrate to light to remove only non-cured portions, to form an etching resist pattern on the substrate, which is then dipped into an etching solution, to obtain a desired circuit pattern.

As shown in FIG. 4G, it is noted that upper and lower surfaces of the body portion 407 of the chip 405 are externally exposed, while the electrode pads 406 thereof are not externally exposed, upon formation of the circuit pattern. Moreover, the electrode pads 406 of the chip 405 are electrically connected to lamination layers by means of the plated layer 409, as mentioned above.

On both surfaces of the central layer 410 formed by the process shown in FIGS. 4A to 4G, a desired number of non-cured resin layers and circuit layers are sequentially laminated, and then, a vacuum heating compression process is performed, to complete a PCB including embedded chips.

FIGS. 5A to 5E sequentially show a process of laminating a non-cured resin layer and a circuit layer on both surfaces of the central layer 410, according to the present invention.

Figure 5A:
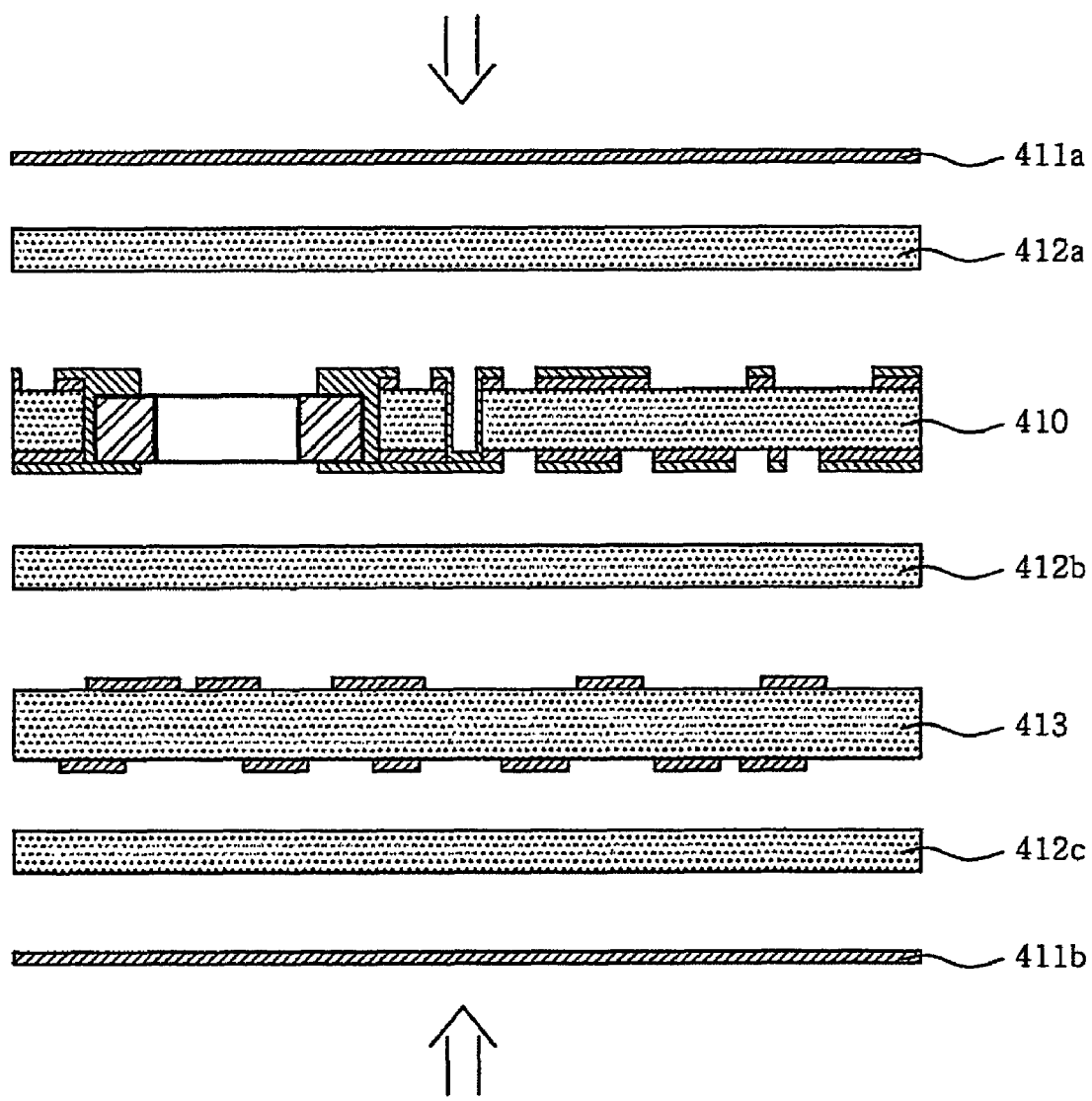
FIGS. 5A to 5E are sectional views sequentially showing a process of laminating a non-cured resin layer and a circuit layer on both surfaces of the central layer, according to the present invention.

In FIG. 5A, non-cured resin layers 412a, 412b and 412c, a circuit layer 413 having circuit patterns on both surfaces thereof, and copper foil layers 411a and 411b are laminated on both surfaces of the central layer 410 formed by the process shown in FIGS. 4A to 4G.

The lamination process as in FIG. 5, which is only an embodiment of the present invention, comprises layering non-cured resin layers and circuit layers each having a circuit pattern on both surfaces of a central layer 410, and layering a copper foil layer as an outermost layer.

Figure 5B:
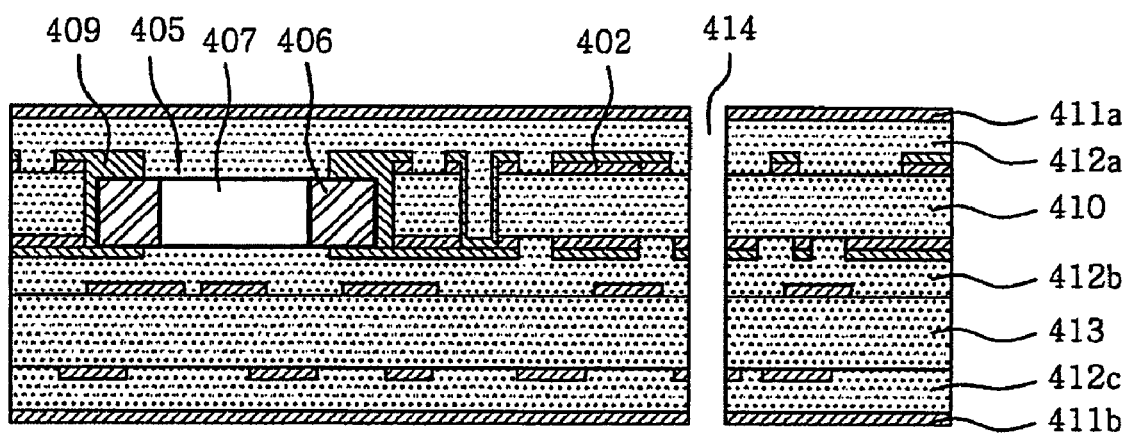

In FIG. 5B, the laminated substrate is heated and compressed from upper and lower surfaces thereof in a vacuum, to form a substrate including an embedded chip 405. By heating and compression in a vacuum, the non-cured resin layers 412a, 412b and 412c attach the central layer 410, the circuit layer 413 and the copper foil layers 411a and 411b to each other while being cured. In this case, the number of circuit layers of the substrate varies with the number of circuit layers laminated as in FIG. 5A.

Figure 5C:
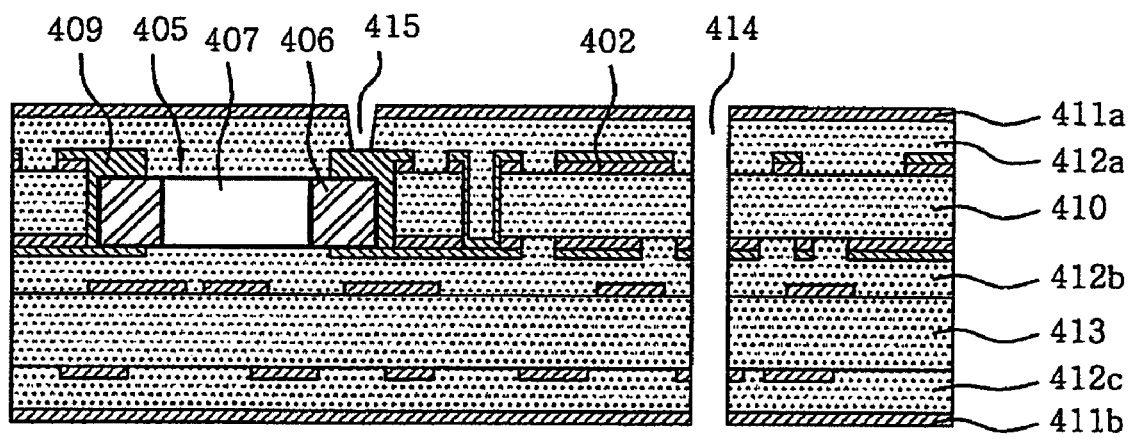

In FIG. 5C, a through hole 414 and a blind via hole 415 are formed through the substrate by a mechanical drilling process, such as a CNC drilling process. After the drilling process, a desmearing process is preferably performed to remove smear.

For more precise drilling, the blind via hole 415 may be formed by laser drilling. However, since a laser cannot perforate the copper foil layers 411a and 411b, the portion of copper foil where the blind via hole 415 is to be formed is first removed by etching, followed by laser drilling.

Figure 5D:
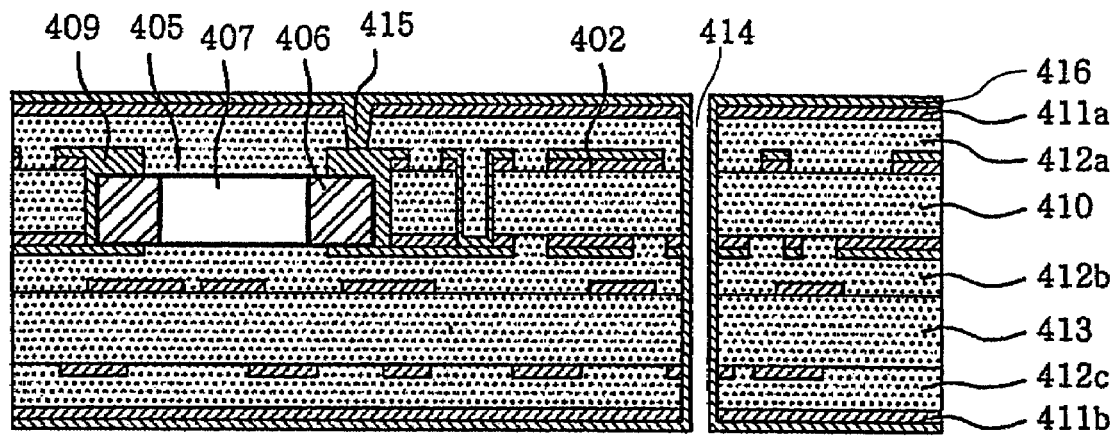

In FIG. 5D, a plating process is performed on the entire surface of the substrate, to form a plated layer 416 on the outer layers of the substrate and the inner walls of the blind via hole 415 and the through hole 414. Before the plating, a washing process is preferably performed to remove impurities or residues.

Figure 5E:
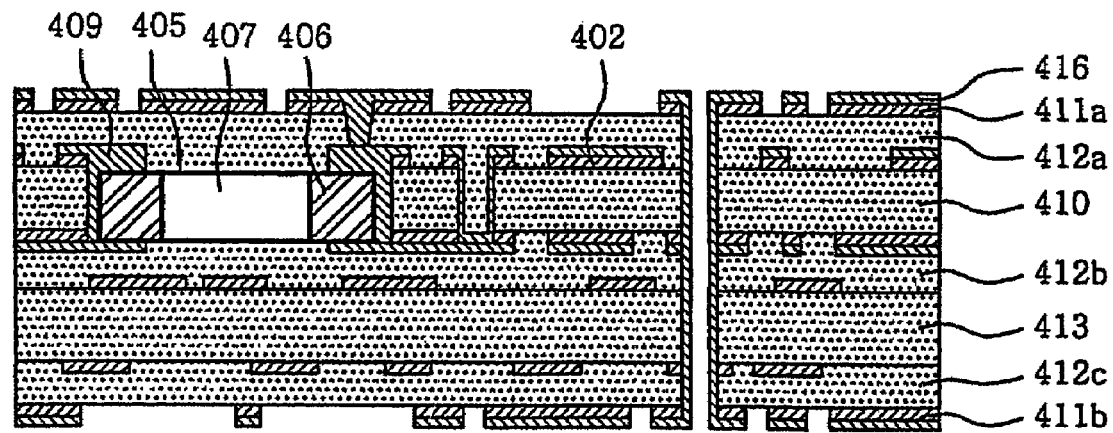

In FIG. 5E, a circuit pattern is formed on outermost layers 411a, 411b, 416 of the substrate. Of the formation methods of the circuit pattern, an etching process is preferably used. The process of forming the circuit pattern by etching comprises the formation of an etching resist pattern, followed by etching, as in the formation of the circuit pattern with reference to FIG. 4G.

As described above, the present invention provides a PCB including embedded chips and a method of fabricating the same using a plating process. According to the method of fabricating the PCB of the present invention, since the chip is fixed to the central layer using a plating process upon formation of the central layer, it can be easily handled in the subsequent processes.

According to the method of fabricating the PCB of the present invention, electrical inspection of the connection state of the chips of the central layer is carried out to correct errors, before performing lamination on the central layer.

According to the method of fabricating the PCB of the present invention, because solder need not be used for electrical connection of the chips, the generation of noise due to the solder is prevented.

According to the method of fabricating the PCB of the present invention, since the chip has a wider connection area to a substrate when a plating process is used, compared to a conventional connection process using solder, electrical properties and radiating properties are improved.

According to the method of fabricating the PCB of the present invention, since the substrate including an inserted chip is washed before being plated, a conventional process of separately washing a chip is omitted, thus reducing the number of total processes.

Further, the fabrication method of the PCB of the present invention can be applied to insert all kinds of chips capable of being fabricated in the forms of thin plates into PCBs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a printed circuit board including embedded chips, comprising the steps of:
    forming a hollow portion to dispose a chip and a via hole through a substrate;
    inserting the chip into the hollow portion;
    plating the surface of the substrate after the chip has been inserted into the hollow portion, such that the plating is formed in spaces defined between the chip and the hollow portion;
    forming circuit patterns on both an upper and a lower surface of the substrate to form a central layer; and
    laminating one or more circuit layers and one or more insulating layers on the substrate.

2. The method as set forth in claim 1, wherein the step of inserting the chip into the hollow portion further comprises the step of attaching an adhesive sheet to one surface of the substrate before insertion of the chip into the hollow portion.

3. The method as set forth in claim 2, wherein the step of plating the entire surface of the substrate further comprises the step of removing the adhesive sheet.

4. The method as set forth in claim 3, wherein the step of plating the entire surface of the substrate further comprises the step of performing a plating process after the removal of the adhesive sheet.

5. The method as set forth in claim 1, wherein the step of forming the circuit patterns on both the upper and the lower surface of the substrate further comprises the step of etching both the upper and the lower surface of the substrate to form the circuit patterns thereon.

6. The method as set forth in claim 1, wherein the laminating step further comprises the steps of:
    alternately laminating one or more non-cured resin layers and the one or more circuit layers on the central layer;
    laminating copper foil layers on both outermost layers of the substrate;
    heating and compressing the laminated non-cured resin layers, the circuit layers, and the copper foil layers; and
    forming the circuit patterns on the copper foil layers of the substrate.

* * * * *